(12) United States Patent
Matsuyama

(10) Patent No.: US 7,235,803 B2
(45) Date of Patent: Jun. 26, 2007

(54) SEMICONDUCTOR RELAY DEVICE

(75) Inventor: Hiroshi Matsuyama, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 53 days.

(21) Appl. No.: 11/191,268

(22) Filed: Jul. 28, 2005

(65) Prior Publication Data
US 2006/0027735 A1    Feb. 9, 2006

(30) Foreign Application Priority Data
Aug. 9, 2004   (JP)   ............... 2004-232222

(51) Int. Cl.
*H01J 40/14*   (2006.01)
*H01J 5/02*   (2006.01)
(52) U.S. Cl. ............. 250/551; 250/214 R; 250/239
(58) Field of Classification Search ........... 250/551, 250/239, 214 R
See application file for complete search history.

(56) References Cited

U.S. PATENT DOCUMENTS 4,296,331 A * 10/1981 Rodriguez ............ 250/551
4,419,586 A * 12/1983 Phipps ............... 250/551
4,564,770 A * 1/1986 Sherman et al. ........ 327/365
6,927,909 B2 * 8/2005 Minemoto ............ 359/484

FOREIGN PATENT DOCUMENTS

JP   2002-261319   9/2002
JP   2003-8050    1/2003

\* cited by examiner

*Primary Examiner*—John R. Lee
(74) *Attorney, Agent, or Firm*—Banner & Witcoff, Ltd

(57) ABSTRACT

A system is described that adjusts the impedance of a circuit. One aspect of the present invention may have: a light-emitting element; a photo detector being configured to receive an optical signal from the light-emitting element, to generate an electrical signal; a switching element being configured to output a signal for driving an outside circuit with being corresponding to the signal; a wiring electrically connecting the switching circuit and the outside circuit; and a base board provided near the wiring, being configured to control a characteristic impedance of the wiring without connecting to the wiring.

18 Claims, 8 Drawing Sheets

SEMICONDUCTOR RELAY DEVICE

CROSS REFERENCES TO RELATED APPLICATION

This application is based upon and claims the benefit of priority from the prior Japanese Patent Application No. 2004-232222, filed on Aug. 9, 2004; the entire contents of which are incorporated herein by reference.

BACKGROUND OF THE INVENTION

A semiconductor relay device (photo relay device) is used in various machines. Specially, it is commonly used as a substitution of a mechanical relay of an IC tester. One advantage of the semiconductor relay is its easiness to insulate a measured IC and measurement. Another advantage is its long life by not having contact points. However, an improvement of the high frequency characteristics is desired, among other improvements.

As the clock frequency of the IC increases, the transmission speed of a signal to be used by the IC tester increases by several 100 MHz or several GHz, as well. Accordingly, high frequency transmission is a requirement for semiconductor relay devices.

A semiconductor relay device has a light-emitting element, a photo-detecting element and a switching circuit, as main composition parts. And, it has also a terminal and a wiring between those inside parts, and between the inside part and the outside circuit.

A conventional semiconductor relay device is described in Japanese patent laid open No. 2003-8050.

But, in a conventional semiconductor relay device, a characteristic impedance of input signal wiring and output signal wiring is beyond several 100Ω. On the other hand, a characteristic impedance of a mounting circuit board is about 50Ω. So there is a discontinuity of characteristic impedance between the input signal wiring and the mounting circuit board, and between the mounting circuit board and the output wiring. Therefore, multiplex reflection occurs in the semiconductor relay device. This multiplex reflection degrades a waveform of a high frequency, as the speed of semiconductor relay device increases.

SUMMARY OF THE INVENTION

Aspects of the present invention address one or more of the problems mentioned above, thereby providing an improved semiconductor relay.

DETAILED DESCRIPTION

The following provides a brief overview of aspects of the present invention.

One aspect of the present invention may have: a light-emitting element; a photo detector being configured to receive an optical signal from the light-emitting element, to generate an electrical signal; a switching element being configured to output a signal for driving an outside circuit with being corresponding to the signal; a wiring electrically connecting the switching circuit and the outside circuit; and a base board provided near the wiring, being configured to control a characteristic impedance of the wiring without connecting to the wiring.

Another aspect of the present invention may A semiconductor relay device, comprising: a light-emitting element; a photo detector electrically insulated from the light-emitting element, being configured to receive an optical signal from the light-emitting element, to generate an electrical signal; a switching element being configured to output a signal for driving an outside circuit with being corresponding to the electrical signal from the photo detector; a first wiring electrically connecting the switching circuit and the outside circuit; a base board provided near the first wiring without electrically connecting to the first wiring; and a mold resin encapsulating the light-emitting element, the photo detector, the switching element, the first wiring and the base board.

It is noted that various connections are set forth between elements in the following description. It is noted that these connections in general and, unless specified otherwise, may be direct or indirect and that this specification is not intended to be limiting in this respect.

Embodiments of the present invention will be explained in reference to the drawings as follows.

THE FIRST EMBODIMENT

A first embodiment of the present invention will be explained with reference to FIG. 1A to FIG. 4.

Figure 1A:
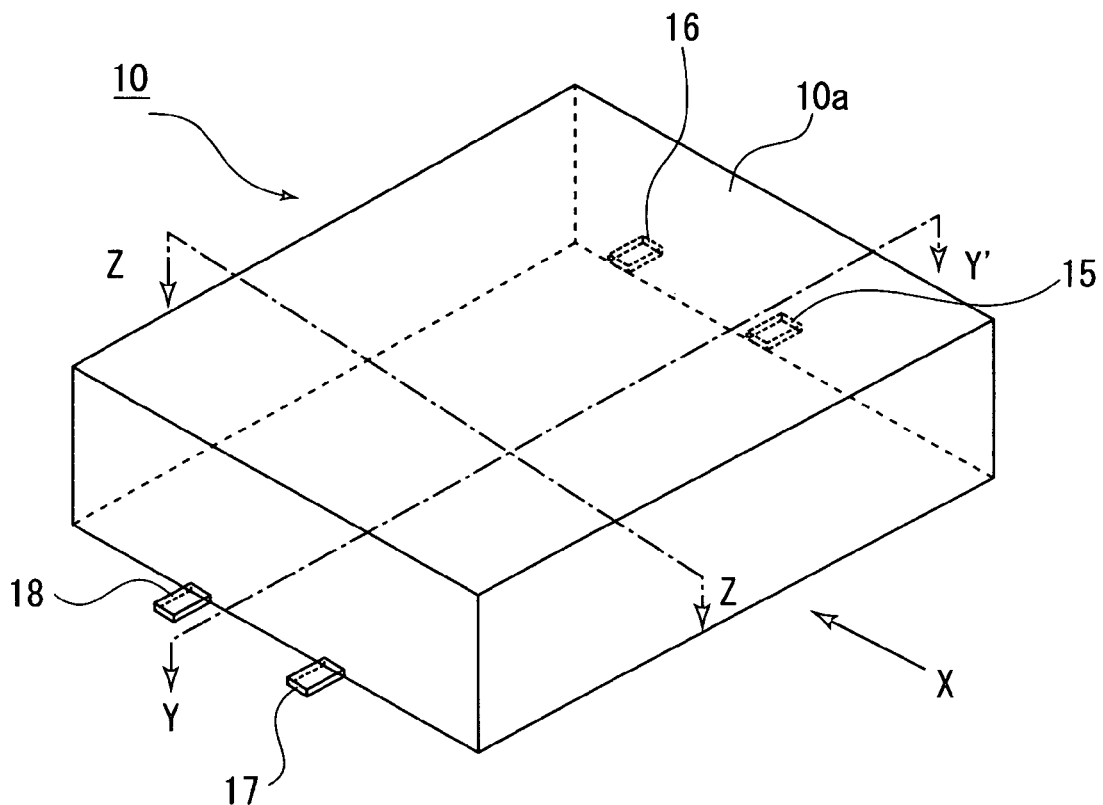
FIGS. 1A and 1B are a perspective view showing an outward form and a perspective view showing an arrangement of internal parts of a first embodiment of a semiconductor relay device in the present invention.
Figure 1B:
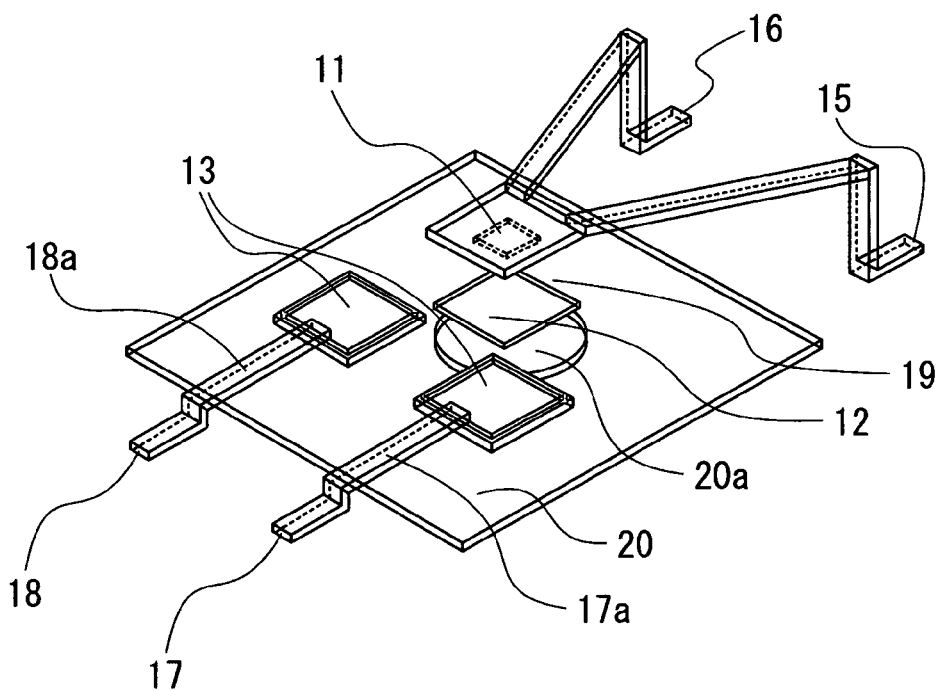

A structure of the first embodiment of semiconductor relay device will be explained. FIG. 1A is a perspective view showing an outward form of a first embodiment of a semiconductor relay device. FIG. 1B is a perspective view showing an arrangement of internal parts of a first embodiment of a semiconductor relay device.

A semiconductor relay device 10 of this embodiment has a mold resin 10a as in FIG. 1A. Mold resin 10a covers internal parts of semiconductor relay device 10. Lead terminals 15–16 for light-emitting element 11 and signal terminals 17–18 are exposed from mold resin 10a. Mold resin 10a is made of a heat resistance material or a humidity resistance material to protect internal parts from external environmental conditions.

Internal parts of semiconductor relay device 10 enclosed by mold resin 10a will be explained with reference to FIG. 1B. A light-emitting element 11, a photo-detecting element array 12 (which is composed of some light-emitting element 12a), and two MOSFET (Metal Oxide Semiconductor Field Effect Transistor) elements 13 as a switching element are contained within the mold resin 10a. A transparent resin 19 such as an Epoxy resin fills an optical transmission pathway between light-emitting element 11 and photo-detecting element array 12.

Photo-detecting element array 12 and MOSFET elements 13 are electrically connected. In contrast, photo-detecting element array 12 and light-emitting element 11, and MOSFET elements 13 and light-emitting element 11 are electrically insulated from each other.

A signal wiring 17a is electrically connected from MOSFET element 13 to signal terminal 17. A signal wiring 18a is connected from MOSFET element 13 to signal terminal 18. Lead terminals for light-emitting element 15–16 are electrically connected to a light-emitting element 11.

Base board 20 is provided near the signal wirings 17 and 18a and provided on the bottom side of mold resin 10a. A protrusion region facing outside of semiconductor relay device 10 is provided in Base board 20. An exposed region 20a is provided which is exposed to outside in the bottom surface of the protrusion region.

Figure 2A:
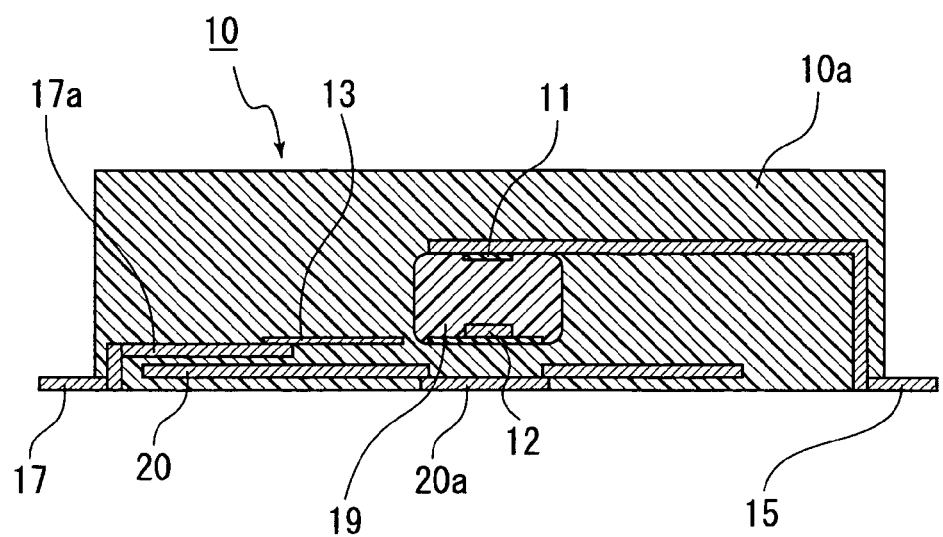
FIGS. 2A and 2B are a Y—Y cross sectional view of a semiconductor relay device of FIG. 1A and a circuit diagram of a first embodiment of a semiconductor relay device in the present invention.

FIG. 2A is a Y—Y cross sectional view seen toward X of a semiconductor relay device of FIG. 1A. Light-emitting element 11 and photo-detecting element array 12 face each other via transparent resin 19. MOSFET element 13 is connected to signal wiring 17a and 18a. Base board 20 is provided near signal wiring 17a and 18a. A distance between Base board 20 and signal wiring 17a and 18a is decided in order to control characteristic impedance of signal wiring 17a and 18a. Base board 20 is connected to ground voltage level (GND) with exposed region 20a.

Figure 2B:
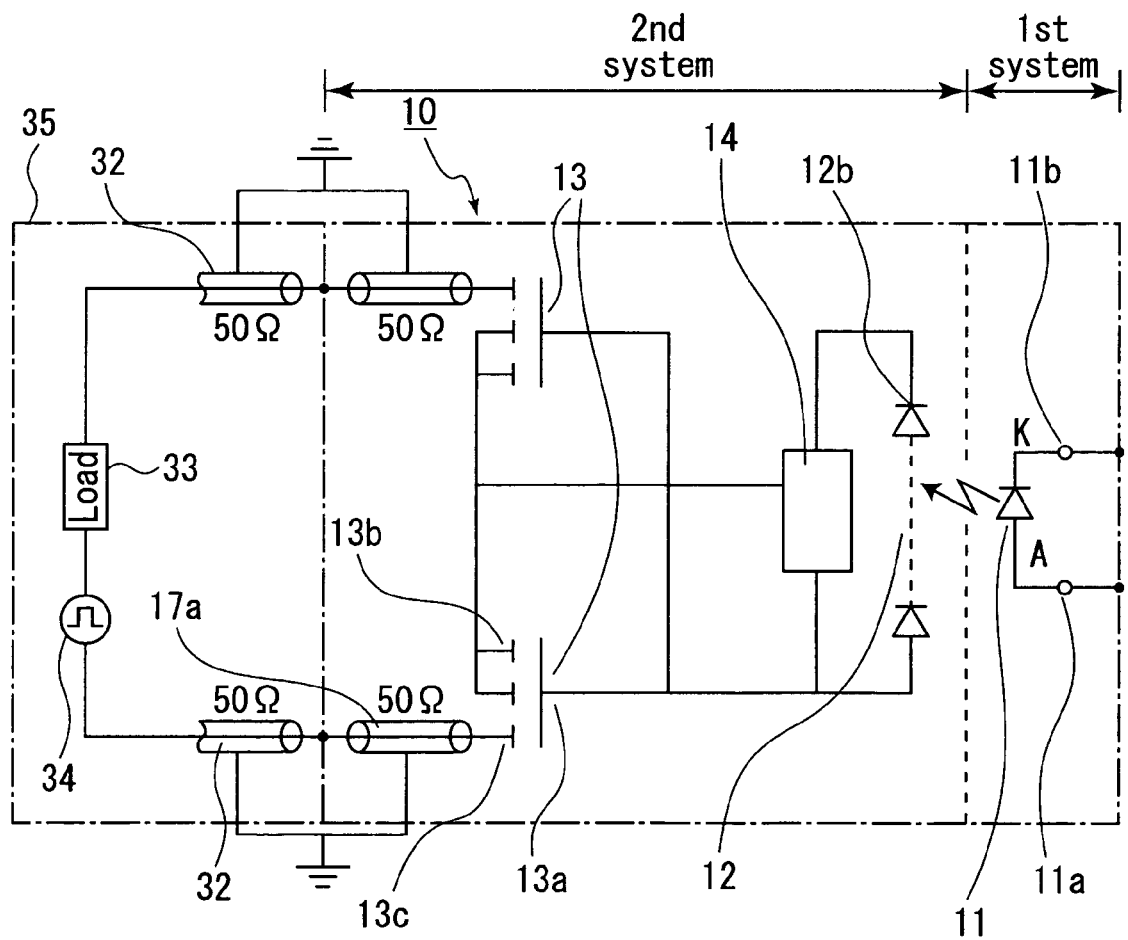

FIG. 2B is a circuit diagram of a first embodiment of a semiconductor relay device in the present invention. A first system and a second are electrically insulated. The first system has light-emitting element 11 (which has an anode 11a and a cathode 11b, anode 11a is connected to a lead terminal for light-emitting element 15 and cathode 11b is connected to a lead terminal for light-emitting element 16). The second system has photo-detecting element array 12 (which has many serial connected photo-detecting elements 12a, a gate discharge circuit for MOSFET 14, and two MOSFET elements 13). Since one photo-detecting element 12a generates a small voltage (light current), it is hard to get a bias voltage to drive the MOSFET. So light current generated by each of the photo-detecting elements 12a is added in order to obtain a bias voltage for the MOSFET.

Photo-detecting element array 12 is connected to a gate 13a of each MOSFET elements 13. Each source 13b of MOSFET elements 13 is connected to gate discharge circuit 14. Drains 13c MOSFET elements 13 are connected to signal terminals 17 and 18 via signal wiring 17a and 18a, respectively.

Signal wiring 17a and 18a is connected to an outside power supply 34 and a load 33 via an outside wiring 32. Output signal from light-emitting element array 12 through MOSFET element 13 is outputted to outside circuit 35. Generally, characteristic impedance of outside wiring 32 is set at 50Ω. It is preferable to set characteristic impedance of signal wirings 17a and 18a the similar value of characteristic impedance of outside wiring 32 (in this case 50Ω). Base board (not shown in FIG. 2B) is not connected to signal wirings 17a and 18a, but it is provided near signal wirings 17a and 18a. The parameter of base board is adjusted so that characteristic impedance of signal wirings 17a and 18a is similar (more preferably same) to characteristic impedance of outside wiring 32.

A movement manner of semiconductor relay device of this embodiment will be explained hereinafter.

In the case a current from lead terminals for light-emitting element 15 does not flow, light-emitting element 11 does not emit a light and photo-detecting element array 13 does not generate a voltage. As a result each gate 13a of two MOSFET elements 13 is not biased and source 13b and drain 13b are not electrically connected. Even if a voltage is added at signal terminal 17, the voltage level of signal terminal 18 does not change.

In the case a current from anode 11a to cathode 11b flows by adding a voltage at the lead terminals for light-emitting element 15, light-emitting element 11 emits a light toward photo-detecting element array 13. Photo-detecting element array 13 (which receive the light) generates a voltage. Source 13b and drain 13c are electrically connected. An inputted voltage at signal terminal 17 is outputted to signal terminal 18 via MOSFET element 13.

Therefore the quality of signal waveform will be explained. In the case the characteristic impedance of outside wiring 32 is 50Ω, it is preferable to set the characteristic impedance of signal wirings 17 and 18 to reduce deterioration of signal waveform. In this embodiment, the characteristic impedance of signal wiring 17a and 18a is adjusted by base board 20.

Figure 3A:
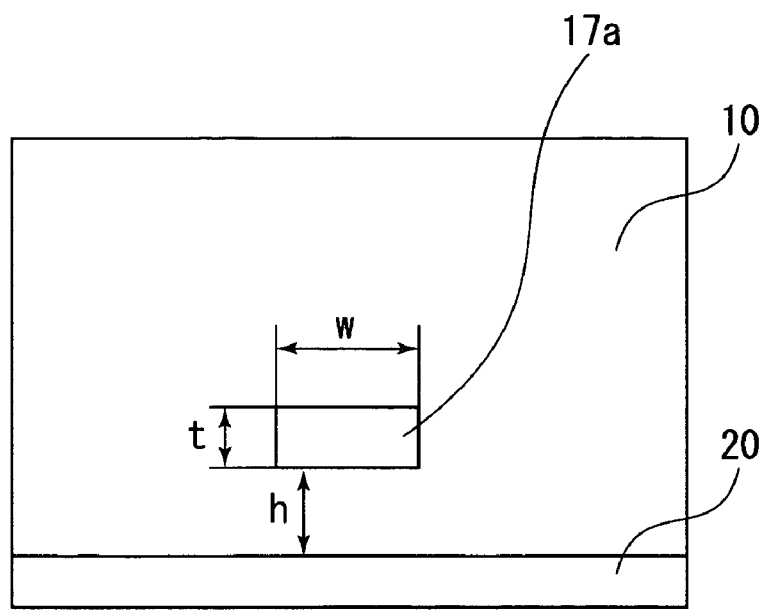
FIGS. 3A and 3B are a Z—Z cross sectional view of a semiconductor relay device of FIG. 1A and a graph showing a relationship between a distance from a base board to a signal line and a characteristic impedance of the signal line of a first embodiment of a semiconductor relay device in the present invention.
Figure 3B:
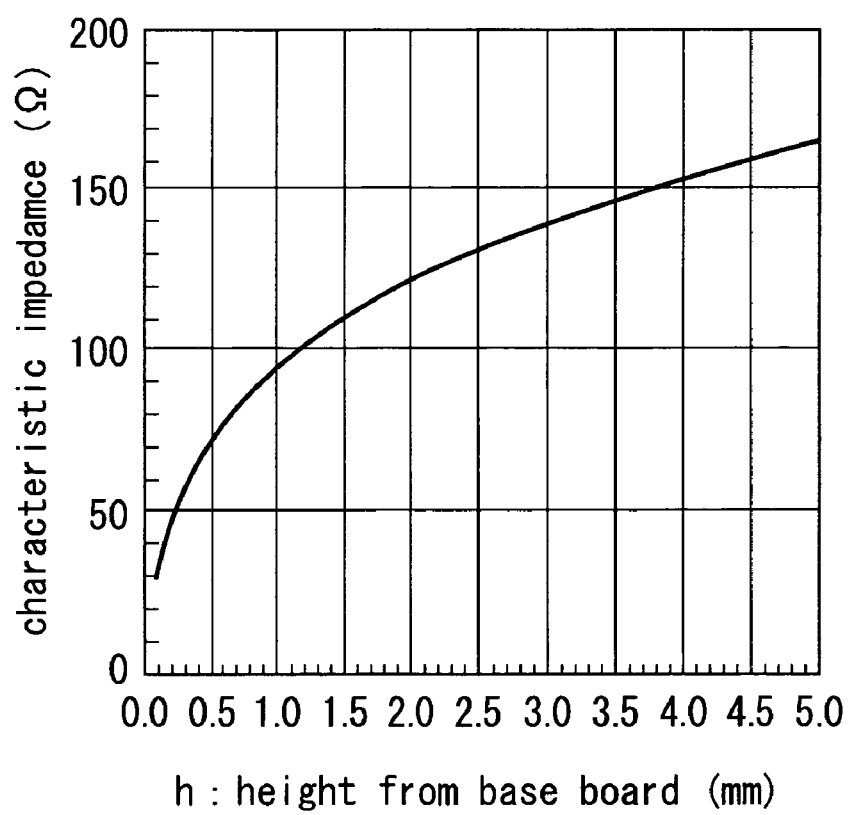

The way of adjusting characteristic impedance of signal wiring 17a and 18a by base board 20 will be explained with reference to FIGS. 3A and 3B hereinafter. FIG. 3A is a Z—Z cross sectional view of a semiconductor relay device of FIG. 1A, showing relationship in arrangement between signal wiring 17a and base board 20. Characteristic impedance of signal wiring 17a is decided on the width (W) of signal wiring 17a, the thinness (t) of wiring 17a, the height (h) from base board 20, and the dielectric constant of mold resin 10. The height means the distance between signal wiring 17a and base board 20. FIG. 3B is showing the change of characteristic impedance of signal wiring 17a, while the height is changed from 0.1 mm to 5.0 mm, in the case the width (W) is 0.4 mm, the thinness (t) is 0.15 mm, and the dielectric constant is about 4–5.

The conventional semiconductor relay device has no base board 20 inside mold resin 10. Rather, the conventional semiconductor relay device includes a mount board outside the mold resin 10. The corresponding distance from signal wiring to a conventional mount board outside mold resin 10 is more than 5 mm. Therefore, the characteristic impedance of signal wiring is at least no less than 150Ω for conventional semiconductor relay devices.

In this embodiment of the present invention, the distances between signal wiring 17a and base board 20 and the distance between signal wiring 18a and base board 20 are set about 25 mm respectively. So the characteristic impedance of signal wiring 17a and signal wiring 18a of aspects of the present invention is about 50Ω.

According to the above mentioned device, reflection among signal wiring 17a and 18a and outside wiring 32 is reduced being compared to a conventional semiconductor relay device, as the characteristic impedance of signal wiring 17a of aspects of the present invention is matched to that of outside wiring 32, and the characteristic impedance of signal wiring 18a is matched to that of outside wiring 32.

Figure 4:
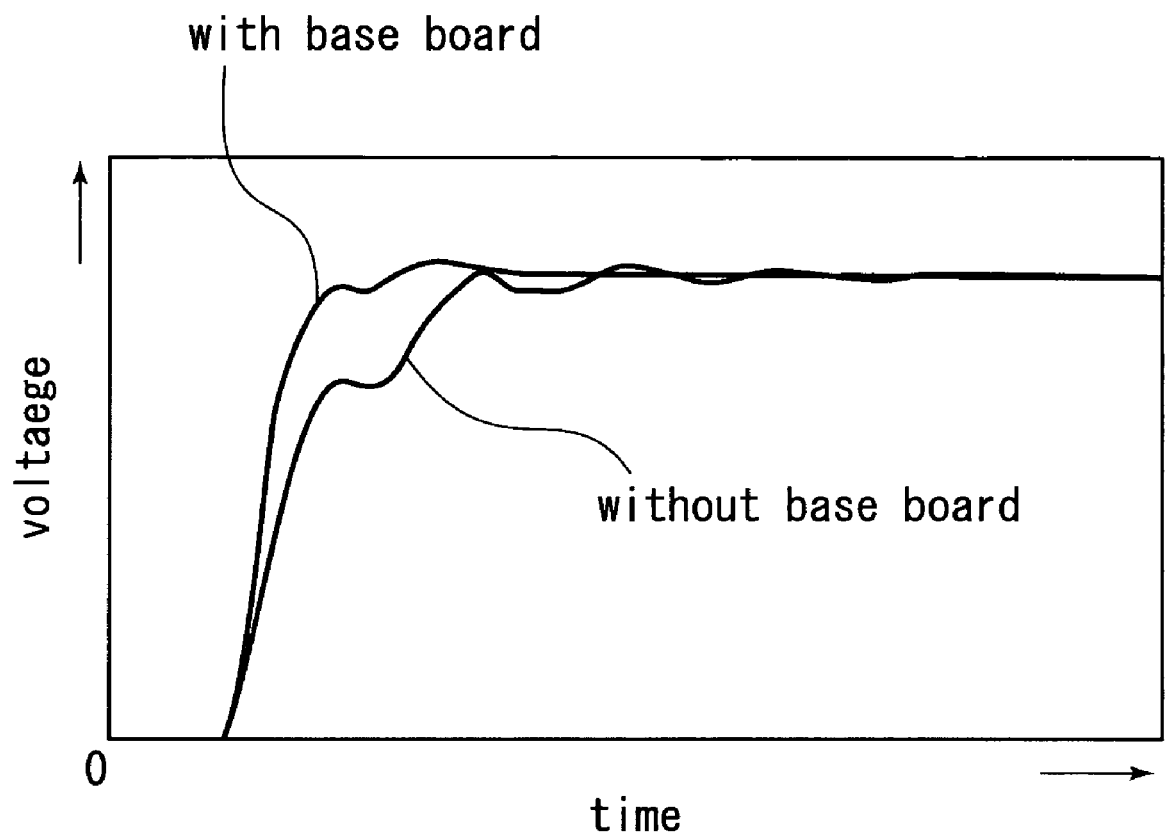
FIG. 4 is a graph showing a waveform of a first embodiment of a semiconductor relay device in the present invention.

FIG. 4 is showing a voltage waveform of a conventional semiconductor relay device, which has no base board, and an output voltage waveform of the semiconductor relay device of this embodiment, which has base board. The rise time of the semiconductor relay device of this embodiment is reduced remarkably comparing to the conventional semiconductor relay device. In other words, the characteristic of high frequency is improved well.

Furthermore, in the conventional semiconductor relay, the distance between signal wiring and ground potential in the mount board, which is provided outside of the semiconductor relay device, varies among devices. On the other hand, the semiconductor relay device in accordance with aspects of the present invention has the base board, so the characteristic impedance of the semiconductor relay device rarely varies. That is a static characteristic is acquired. Furthermore, the semiconductor relay device is rarely influenced by noise associated with the base board.

According to above mentioned, the base board improves a high frequency characteristic, resistance to noise, and efficiency of heat radiation of semiconductor relay device.

THE SECOND EMBODIMENT

With respect to each portion of this second embodiment, the same portion of the semiconductor relay device of the first embodiment shown in FIG. 1 is designated by the same reference numeral, and its explanation is omitted.

In the semiconductor relay device of the first embodiment, the shape of the base board is almost flat except protrusion region. On the other hand, in this second embodiment the shape of the base board is meshed.

Figure 5:
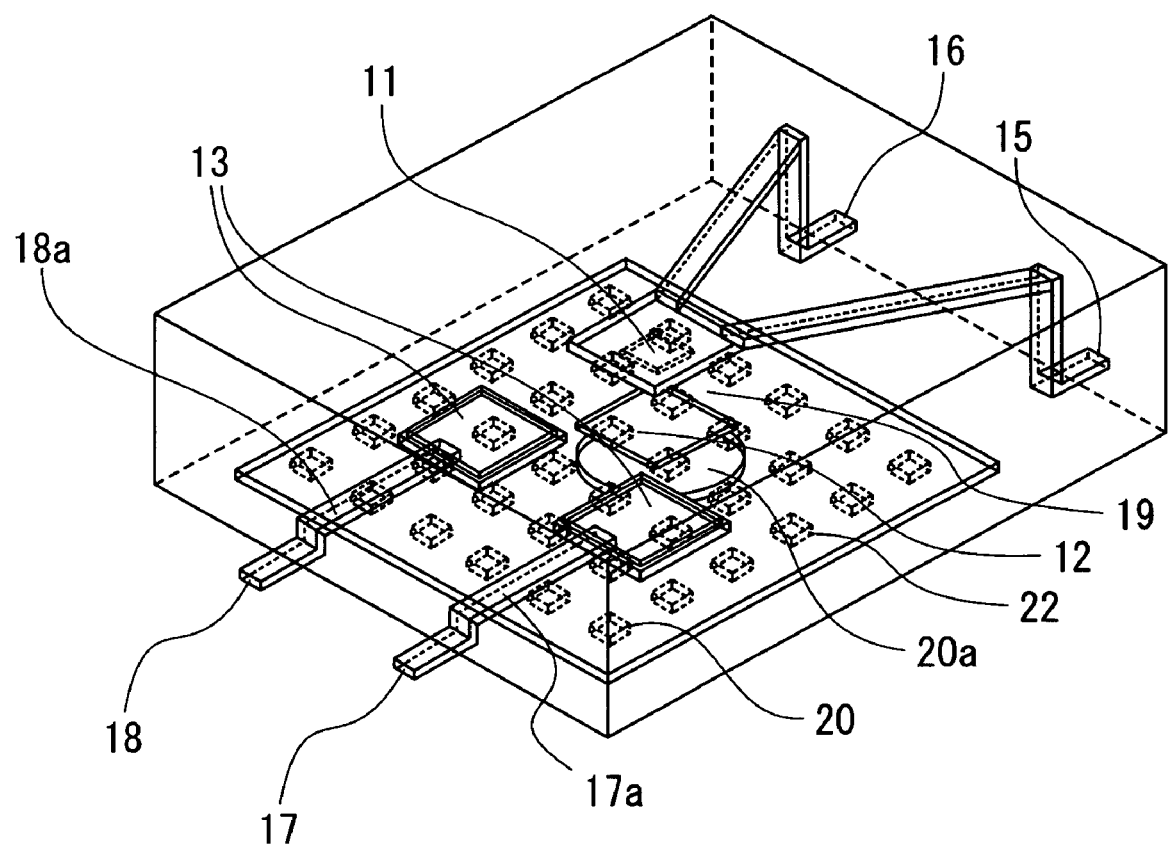
FIG. 5 is a perspective view showing an arrangement of internal parts of a second embodiment of a semiconductor relay device in the present invention.

The structure of this embodiment will be explained with reference to FIG. 1A and FIG. 5 hereinafter. The perspective view of this embodiment is similar to the first embodiment shown in FIG. 1A. A semiconductor relay device 10 of this embodiment has a mold resin 10a as in FIG. 1A. Mold resin 10a covers internal parts of semiconductor relay device 10. A lead terminal for light-emitting element 15–16 and a signal terminal 17–18 are exposed from mold resin 10a. Mold resin 10a is made of a heat resistance material or a humidity resistance material to protect internal parts from outsider circumstance.

Internal parts of semiconductor relay device 10 enclosed by mold resin 10a will be explained with reference to FIG. 5. FIG. 5 is a perspective view showing an arrangement of internal parts of a second embodiment of a semiconductor relay device in the present invention.

A light-emitting element 11, a photo-detecting element array 12 is composed of some light-emitting element 12a, and two MOSFET elements 13 as a switching element. A transparent resin 19 such as Epoxy resin fills an optical transmission pathway between light-emitting element 11 and photo-detecting element array 12.

Photo-detecting element array 12 and MOSFET elements 13 are electrically connected. But photo-detecting element array 12 and light-emitting element 11, and MOSFET elements 13 and light-emitting element 11 are electrically insulated. A signal wiring 17a is electrically connected from MOSFET element 13 to signal terminal 17. A signal wiring 18a is connected from MOSFET element 13 to signal terminal 18. Lead terminals for light-emitting element 15–16 are electrically connected to a light-emitting element 11.

Furthermore, base board 20 is provided near the signal wirings 17 and 18a and provided on the bottom side of mold resin 10a. A protrusion region facing outside of semiconductor relay device 10 is provided in Base board 20. An exposed region 20a is provided, which is exposed to outside in the bottom surface of the protrusion region. In addition, a plurality of openings 22a is provided in the base board 20 constantly. So the shape of the semiconductor relay is meshed. In FIG. 5 the openings 22a are penetrated through the base board 20.

Therefore, the junction between mold resin 10 and base board 20 is stronger. The influence of temperature change of the external environmental conditions and a stress based on environmental conditions are reduced with comparing to the first embodiment, so semiconductor relay device with high reliability may be realized.

In this embodiment the shape of the base board is meshed. But it is not limited to the meshed base board. The base board may be slit, dimpled, recessed, depressed or have openings irregularly. The openings may be penetrated through or not. In other words the shape of the opening is capable of improving the strength of the junction between base board 20 and mold resin 10.

THE THIRD EMBODIMENT

With respect to each portion of this third embodiment, the same portion of the semiconductor relay device of the first or the second embodiment shown in FIG. 1 is designated by the same reference numeral, and its explanation is omitted.

In the first embodiment, base board 20 has a protrusion region facing outward near the center of the base board 20. An exposed region 20a is provided, which is exposed to outside in the bottom surface of the protrusion region. Exposed region 20a is connected to the GND potential directly.

On the other hand base board 20 is connected to GND potential via a lead terminal 23.

Figure 6:
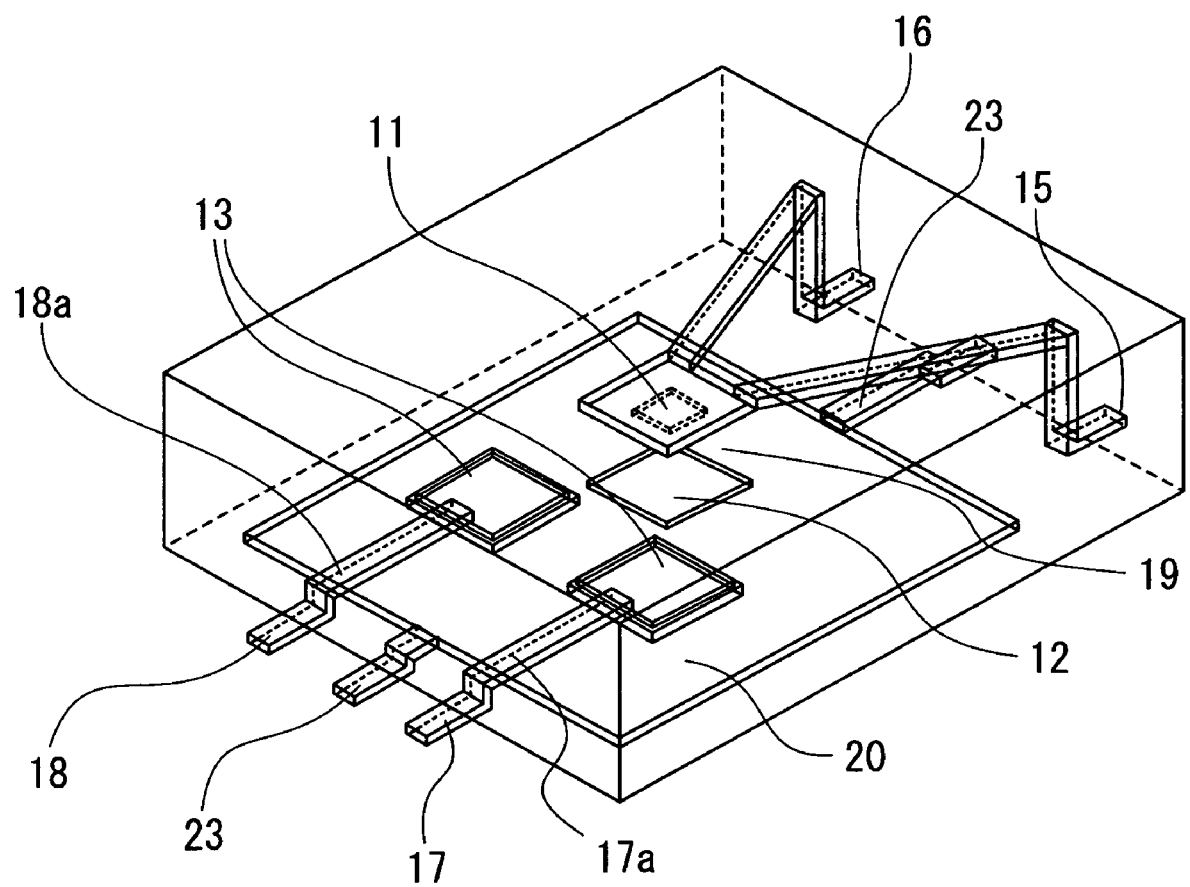
FIG. 6 is a perspective view showing an arrangement of internal parts of a third embodiment of a semiconductor relay device in the present invention.

The structure of this embodiment will be explained with reference to FIG. 1A and FIG. 6 hereinafter. The perspective view of this embodiment is similar to the first embodiment shown in FIG. 1A. A semiconductor relay device 10 of this embodiment has a mold resin 10a as in FIG. 1A. Mold resin 10a covers internal parts of semiconductor relay device 10. A lead terminal for light-emitting element 15–16 and a signal terminal 17–18 are exposed from mold resin 10a. Mold resin 10a is made of a heat resistance material or a humidity resistance material to protect internal parts from outsider circumstance.

Internal parts of semiconductor relay device 10 enclosed by mold resin 10a will be explained with reference to FIG. 6. FIG. 6 is a perspective view showing an arrangement of internal parts of a second embodiment of a semiconductor relay device in the present invention.

A light-emitting element 11, a photo-detecting element array 12 which is composed of some light-emitting element 12a, and two MOSFET elements 13 as a switching element. A transparent resin 19 such as Epoxy resin fills an optical transmission way between light-emitting element 11 and photo-detecting element array 12.

Photo-detecting element array 12 and MOSFET elements 13 are electrically connected. But photo-detecting element array 12 and light-emitting element 11, and MOSFET elements 13 and light-emitting element 11 are electrically insulated. A signal wiring 17a is electrically connected from MOSFET element 13 to signal terminal 17a signal wiring 18a is connected from MOSFET element 13 to signal terminal 18. Lead terminals for light-emitting element 15–16 are electrically connected to a light-emitting element 11.

Furthermore, base board 20 is provided near the signal wirings 17 and 18a and provided on the bottom side of mold resin 10a. Lead terminal 23 is connected to base board 20. Base board 20 is connected to GND potential at the outside of the semiconductor relay device 60 via lead terminal 23.

Base board 20 controls the characteristic impedance of the signal wirings 17a and 18a.

The semiconductor relay device of this embodiment has lead terminal 23. So the package design (pin assignment) of the semiconductor relay device is the same as the conventional one.

THE FORTH EMBODIMENT

With respect to each portion of this fourth embodiment, the same portion of the semiconductor relay device of the first, second and third embodiment shown in FIG. 1 is designated by the same reference numeral, and its explanation is omitted.

The structure of this embodiment is similar to the third embodiment. In this embodiment, light-emitting element 11 is provided on the bottom side of the mold resin 10 and photo-detecting element array 12 is upper side of the mold resin 10. Base board 20 is provided above receiving element array 12 in the mold resin 10. Base board 20 is connected to GND potential at the outside of the semiconductor relay device via lead terminal.

Figure 7:
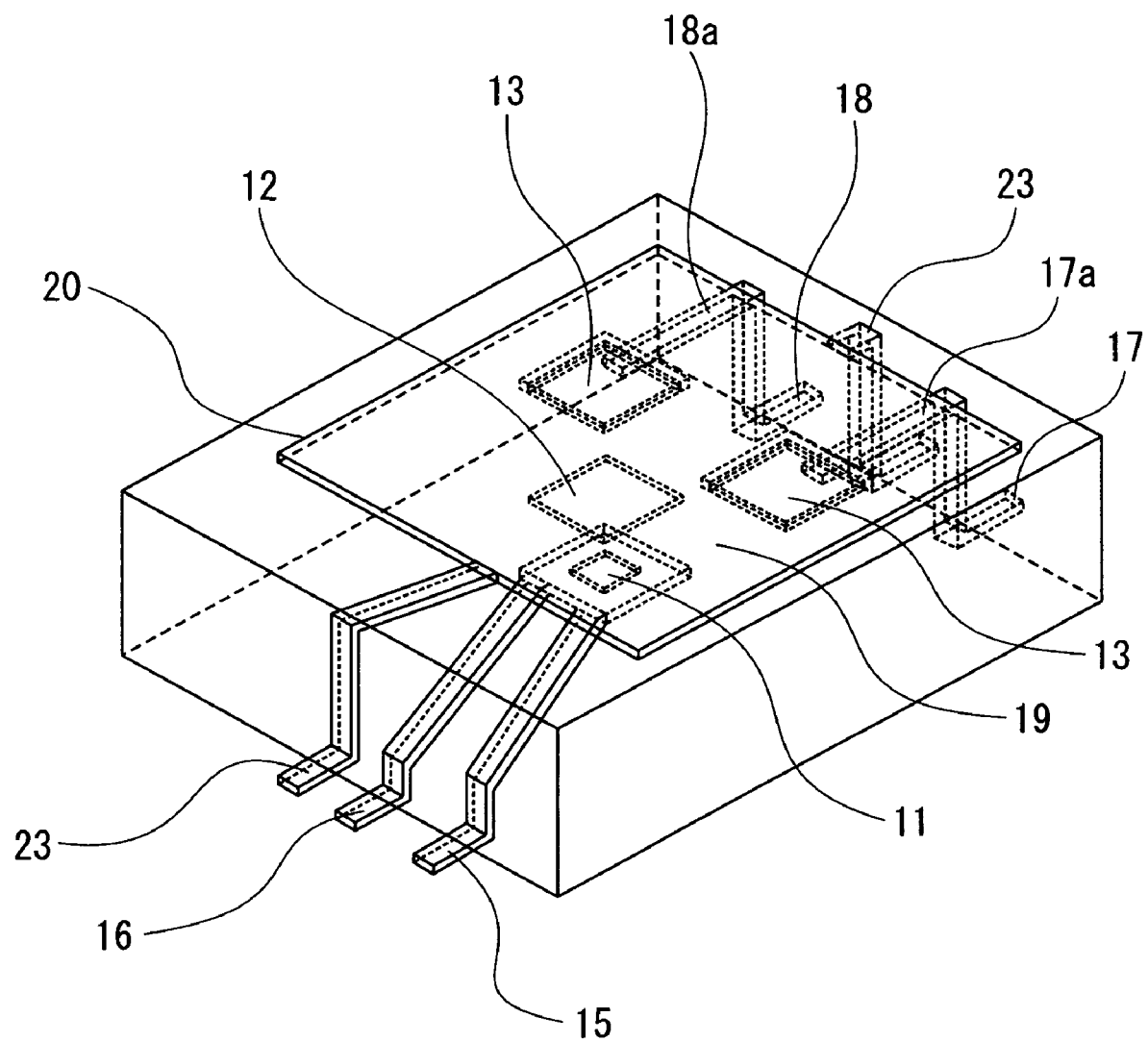
FIG. 7 is a perspective view showing an arrangement of internal parts of a forth embodiment of a semiconductor relay device in the present invention.

The structure of this embodiment will be explained with reference to FIG. 1A and FIG. 7 hereinafter. The perspective view of this embodiment is similar to the first embodiment shown in FIG. 1A. A semiconductor relay device 10 of this embodiment has a mold resin 10a as in FIG. 1A. Mold resin 10a covers internal parts of semiconductor relay device 10. A lead terminal for light-emitting element 15–16 and a signal terminal 17–18 are exposed from mold resin 10a. Mold resin 10a is made of a heat resistance material or a humidity resistance material to protect internal parts from environmental conditions.

Internal parts of semiconductor relay device 70 enclosed by mold resin 10a will be explained with reference to FIG. 7. FIG. 7 is a perspective view showing an arrangement of internal parts of a forth embodiment of a semiconductor relay device in the present invention.

A light-emitting element 11, a photo-detecting element array 12 is composed of some light-emitting element 12a, and two MOSFET elements 13 as a switching element. A transparent resin 19 such as Epoxy resin fills an optical transmission way between light-emitting element 11 and photo-detecting element array 12.

Being different from the third embodiment, light-emitting element 11 is provided below photo-detecting element array 12. A signal wiring 17a is electrically connected from MOSFET element 13 to signal terminal 17. A signal wiring 18a is connected from MOSFET element 13 to signal terminal 18. Lead terminals for light-emitting element 15–16 are electrically connected to a light-emitting element 11.

Base board 20 is provided near the signal wirings 17 and 18a and provided on the upper side of mold resin 10a. Base board 20 is connected to GND potential at the outside of the semiconductor relay device via lead terminal.

Base board 20 controls the characteristic impedance of the signal wirings 17a and 18a.

The semiconductor relay device of this embodiment has lead terminal 23. So the package design (pin assignment) of the semiconductor relay device is the same as the conventional one.

Furthermore, the base board is provided to being configured to cover the upper side of mold resin, so the base board is capable of protecting the semiconductor relay device from outside noise.

THE FIFTH EMBODIMENT

In this embodiment, a semiconductor relay device which is assembled a plurality of single semiconductor relay device will be explained hereinafter.

Figure 8A:
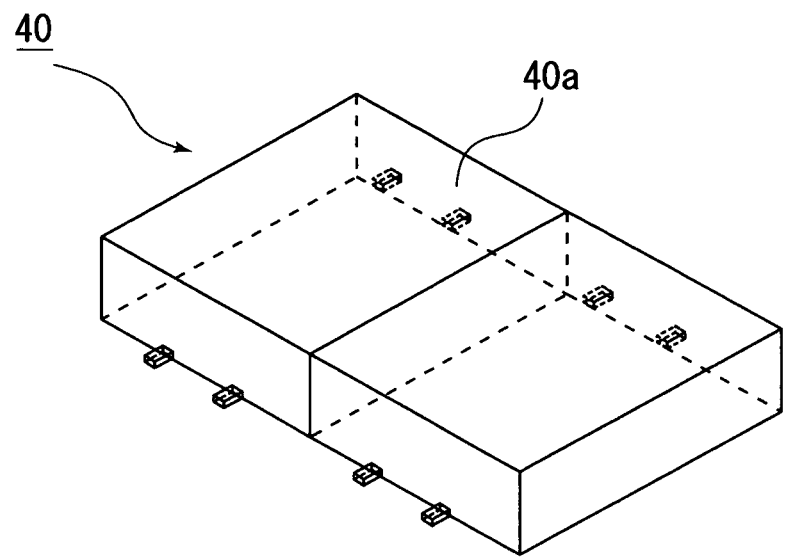
FIGS. 8A and 8B are perspective views of a fifth embodiment of a semiconductor relay device in the present invention.
Figure 8B:
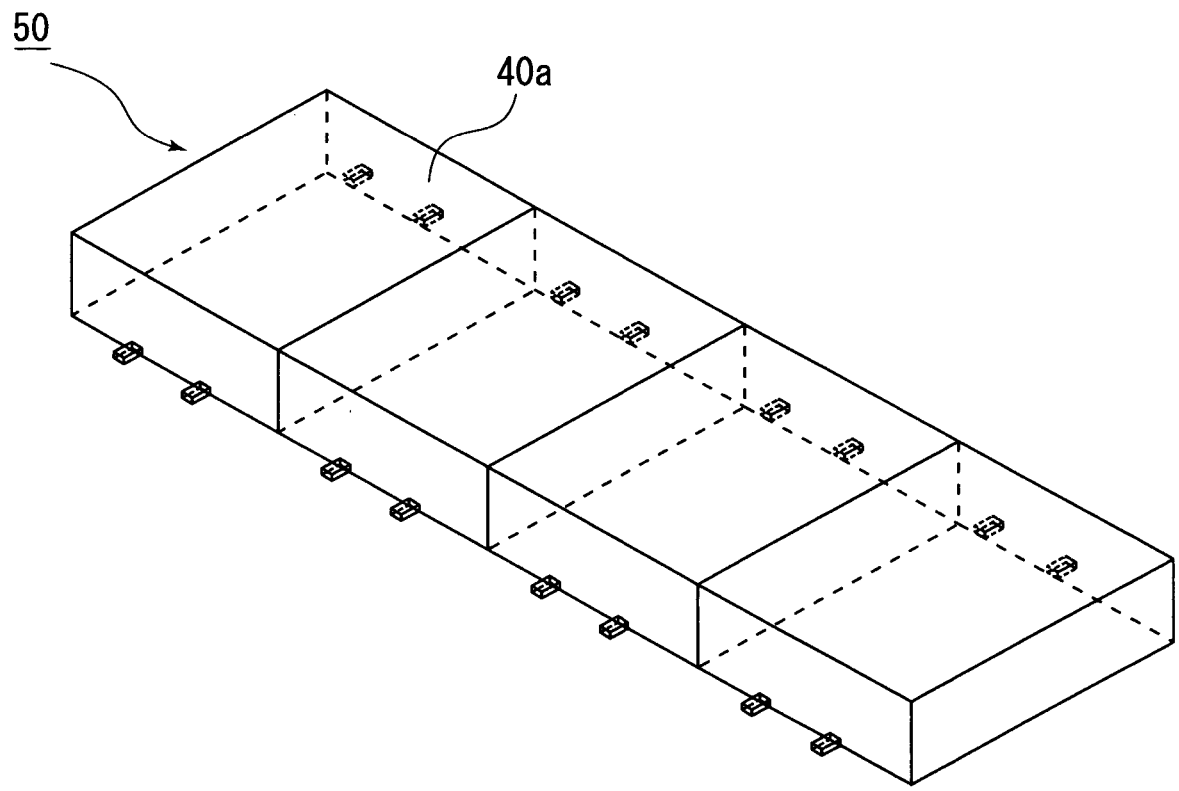

FIG. 8A is a perspective view of semiconductor relay device which has two single semiconductors relay and FIG. 8B is a perspective view of semiconductor relay device, which has four single semiconductor relays.

Semiconductor relay 40a is the same one shown in first to fourth embodiment. With respect to each portion of this fifth embodiment, the same portion of the semiconductor relay device of the first, second, third or fourth embodiment shown in FIG. 1A–FIG. 7 is designated by the same reference numeral, and its explanation is omitted.

Base board 20 in the semiconductor relay 40a controls the characteristic impedance of the signal wirings 17a and 18a.

Semiconductor relay device 40 shown in FIG. 8A has two semiconductor relay 40a and is applied for transferring two channel signals. Semiconductor relay device 50 shown in FIG. 8B has four semiconductor relay 40a and is applied for transferring four channel signals.

Other embodiments of the present invention will be apparent to those skilled in the art from consideration of the specification and practice of the invention disclosed herein. It is intended that the specification and example embodiments be considered as illustrative only, with a true scope and spirit of the invention being indicated by the following.

For example, the quantity, the shape and the place of the base board, the protrusion region and exposed region is not limited to above-mentioned embodiment. It is available that the base board is provided near the signal wiring and is not provided around or far from the signal wiring. It is also available that the base board has a plurality of protrusion and has a plurality of exposed region.

Furthermore, the material of the base board may be adapted such as cupper (Cu), cobalt (Co), tungsten (W), various alloys, and other electric conductive material.

In these embodiments, the characteristic impedance of the signal wiring is assumed 50Ω. This assumption comes from the general characteristic impedance of wiring of a mount board which the semiconductor relay is mounted on. If the characteristic impedance of wiring of a mount board is another value, the characteristic impedance of signal wiring in the semiconductor relay is adjusted to the value.

In the case a plurality of semiconductor relay is applied to a mount board of an IC tester, the heat radiation from the semiconductor relay is improved by the base board. So it is available to a wide range of operating temperatures.

The present invention has been described in terms of preferred and illustrative embodiments thereof. Numerous other embodiments, modifications and variations within the scope and spirit of the appended claims will occur to persons of ordinary skill in the art from a review of this disclosure.

What is claimed is:

1. A semiconductor relay device, comprising:
   a light-emitting element;

a photo detector electrically insulated from the light-emitting element, being configured to receive an optical signal from the light-emitting element, to generate an electrical signal;

a switching element being configured to output a signal for driving an outside circuit with the electrical signal from the photo detector;

a first wiring electrically connecting the switching circuit and the outside circuit; and a base board provided near the first wiring without electrically connecting to the first wiring.

2. The semiconductor relay device of claim 1, wherein the base board is configured to control a characteristic impedance of the first wiring.

3. The semiconductor relay device of claim 1, wherein the base board is provided to control a characteristic impedance of the first wiring to be matched with a characteristic impedance of an outside wiring, the outside wiring is provided next to the signal wiring in the outside circuit.

4. The semiconductor relay device of claim 1, wherein the base board is connected to a ground potential.

5. The semiconductor relay device of claim 1, wherein the base board has a protrusion toward outside.

6. The semiconductor relay device of claim 5, wherein the protrusion is provided under the photo detector.

7. The semiconductor relay device of claim 1, wherein an exposed region is provided in the base board, the base board is connected to a ground potential via the exposed region.

8. The semiconductor relay device of claim 1, wherein the base board has a meshed shape.

9. The semiconductor relay device of claim 1, further comprising a second wiring connected from the light-emitting element, wherein a distance from the second wiring to the base board is larger than a distance from the first wiring to the base board.

10. A semiconductor relay device, comprising:

a light-emitting element;

a photo detector electrically insulated from the light-emitting element, being configured to receive an optical signal from the light-emitting element, to generate an electrical signal;

a switching element being configured to output a signal for driving an outside circuit with the electrical signal from the photo detector;

a first wiring electrically connecting the switching circuit and the outside circuit;

a base board provided near the first wiring without electrically connecting to the first wiring; and a mold resin encapsulating the light-emitting element, the photo detector, the switching element, the first wiring and the base board.

11. The semiconductor relay device of claim 10, wherein the base board is configured to control a characteristic impedance of the first wiring.

12. The semiconductor relay device of claim 10, wherein the base board is provided to control a characteristic impedance of the first wiring to be matched with a characteristic impedance of an outside wiring, the outside wiring is provided next to the signal wiring in the outside circuit.

13. The semiconductor relay device of claim 10, wherein the base board is connected to a ground potential.

14. The semiconductor relay device of claim 10, wherein the base board has a protrusion toward outside.

15. The semiconductor relay device of claim 14, wherein the protrusion is provided under the photo detector.

16. The semiconductor relay device of claim 10, wherein an exposed region is provided in the base board, the exposed region is exposed to outside from the mold resin, the base board is connected to a ground potential via the exposed region.

17. The semiconductor relay device of claim 10, wherein the base board has a meshed shape.

18. The semiconductor relay device of claim 10, further comprising a second wiring connected from the light-emitting element, wherein a distance from the second wiring to the base board is larger than a distance from the first wiring to the base board.

* * * * *